(12) United States Patent
Chen et al.

(10) Patent No.: US 7,190,150 B2
(45) Date of Patent: Mar. 13, 2007

(54) DC—DC CONVERTER FOR POWER LEVEL TRACKING POWER AMPLIFIERS

(75) Inventors: Jau H. Chen, Atlanta, GA (US); Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 40 days.

(21) Appl. No.: 11/068,272

(22) Filed: Feb. 28, 2005

(65) Prior Publication Data

US 2006/0192536 A1 Aug. 31, 2006

(51) Int. Cl.
*G05F 1/00* (2006.01)

(52) U.S. Cl. ............... 323/222; 323/274; 323/284; 323/283

(58) Field of Classification Search ......... 323/222, 323/274, 284, 283
See application file for complete search history.

(56) References Cited

U.S. PATENT DOCUMENTS

| | | | | |
|---|---|---|---|---|
| 4,502,152 A | * | 2/1985 | Sinclair | ............ 455/73 |
| 5,548,206 A | | 8/1996 | Soo | |
| 5,627,460 A | * | 5/1997 | Bazinet et al. | ............ 323/288 |
| 5,773,966 A | * | 6/1998 | Steigerwald | ............ 323/284 |
| 5,998,977 A | * | 12/1999 | Hsu et al. | ............ 323/272 |
| 6,452,368 B1 | * | 9/2002 | Basso et al. | ............ 323/282 |
| 6,480,367 B2 | * | 11/2002 | Shi et al. | ............ 361/18 |
| 6,583,520 B2 | * | 6/2003 | Shi et al. | ............ 307/33 |

OTHER PUBLICATIONS

RF Power Amplifier Efficiency Improves With Varied Vcc, From DC—DC Supply, Maxim Application Note, May 26, 2004, http://www.maxim-ic.com/appnotes.cfm/appnote_number/3247.

J. Staudinger, B. Gilsdorf, D. Newman, G. Norris, G. Sadowniczak, R. Sherman, and T. Quach, High Efficiency CDMA RF Power Amplifier Using Dynamic Envelope Tracking Technique, IEEE MTT-S Digest, pp. 873-876, 2000.

Jau-Horng Chen, Kongpop U-Yen, and J. Stevenson Kenney, An Envelope Elimination and Restoration Power Amplifier Using a CMOS Dynamic Power Supply Circuit, IEEE MTT-S Digest, pp. 1519-1522, 2004.

David K. Su, and William J. McFarland, An IC for Linearizing RF Power Amplifiers Using Envelope Elimination and Restoration, IEEE J. Solid-State Circuits, vol. 33, No. 12, pp. 2252-2258, Dec. 1998.

Jim Kay, Cutting RF Power in W-CDMA Phones, EETimes, Jun. 2004, http://www.eet.com/in_focus/mixed_signals/showArticle.jhtml?articleID=22101836.

* cited by examiner

*Primary Examiner*—Bao Q. Vu
(74) *Attorney, Agent, or Firm*—Ingrassia Fisher & Lorenz

(57) ABSTRACT

A DC-to-DC converter as described herein is suitable for use as a variable voltage supply for an RF power amplifier. The DC-to-DC converter includes a buck converter for providing relatively low voltage and current output, and a linear voltage regulator for providing relatively high voltage and current output. When operating in a buck converter mode, the DC-to-DC converter disables the linear voltage regulator, thus providing efficient low-level operation. When operating in a linear regulator mode, the DC-to-DC converter enables the linear voltage regulator while maintaining at least some current flow through the buck converter; this is accomplished by keeping an output transistor of the buck converter continuously on during the linear regulator mode. The DC-to-DC converter can transition between operating modes in a smooth manner that does not result in discontinuous voltage drops.

18 Claims, 6 Drawing Sheets

DC—DC CONVERTER FOR POWER LEVEL TRACKING POWER AMPLIFIERS

TECHNICAL FIELD

The present invention relates generally to electronic devices. More particularly, the present invention relates to a DC-to-DC converter suitable for use as a variable voltage supply for a power amplifier.

BACKGROUND

The prior art is replete with DC-to-DC converters, which are circuits or devices designed to produce an output DC voltage in response to an input DC voltage. For example, a DC-to-DC converter can be used to regulate the supply voltage (e.g., the collector or drain voltage) of an RF power tracking amplifier, thus resulting in more efficient operation. DC-to-DC converters may be used to vary the supply voltage of the transmit RF power amplifier of a wireless device, such as a CDMA mobile handset. In such applications, the DC-to-DC converter should have good light-load efficiency because the RF power amplifier usually operates at 15–30 dB below the maximum output power level. In mobile applications, the DC-to-DC converter should also be capable of supplying the voltage required by the RF power amplifier during maximum RF output power with little voltage drop from the battery voltage. Furthermore, the DC-to-DC converter should be able to provide a continuously changing voltage because any step change to the RF power amplifier supply voltage may cause the handset to lose its RF communication channel.

Many dynamic supply RF power amplifiers employ a buck converter to generate the desired DC output voltage. As depicted in FIG. 1, most implementations use a buck converter 100 to convert a battery voltage (identified as $V_{dd}$ in FIG. 1) to a lower voltage $V_{out}$ in response to an input DC voltage $V_{in}$ as needed by an RF power amplifier 102. The thick arrow in FIG. 1 represents a high peak current condition. Since RF power amplifier 102 is not directly connected to the battery, buck converter 100 must be able to supply a relatively high peak current to RF power amplifier 102 to handle high power conditions. Consequently, the switching transistors 104/106 must be relatively large in size to carry such high peak current. In addition, when RF power amplifier 102 operates in a relatively low power mode, it draws a relatively low peak current, which can cause buck converter 100 to operate inefficiently. Furthermore, at maximum current output, $V_{out}$ generated by buck converter 100 must be as close as possible to the battery voltage. At maximum current output, however, the DC current flows through transistor 104 and an inductor 108. Thus, in an effort to minimize voltage drop across transistor 104 and inductor 108, the "on" resistance of transistor 104 and the DC resistance of inductor 108 must be minimized, which usually requires a very large sized transistor 104 and a very large sized inductor 108, both of which are undesirable in practical embodiments.

FIG. 2 is a schematic representation of a prior art DC-to-DC converter 200 that includes a buck converter 202 connected in parallel with a bypass transistor 204. In this arrangement, bypass transistor 204 has a relatively low "on" resistance, and bypass transistor 204 is connected to a battery 206. Although not shown in FIG. 2, the DC output $V_{out}$ is connected to the drain or collector of the RF power amplifier. When the RF power amplifier needs to operate at relatively high RF power levels, its drain/collector is connected to battery 206 through bypass transistor 204. At lower power levels, however, buck converter 202 (which includes a transistor 208 and an inductor 210) provides a reduced $V_{out}$ to the RF power amplifier to increase the overall efficiency. Although such an implementation can employ smaller transistors for buck converter 202 (in comparison to the arrangement shown in FIG. 1), and can avoid an undesirable voltage drop through transistor 208 and inductor 210, the change of state between the buck converter mode of operation and the bypass transistor mode of operation is non-continuous. In other words, either buck converter 202 or bypass transistor 204 (but not both) is active at any given time, and DC-to-DC converter 200 merely switches between the two modes using a controller 212. In a practical deployment, the resulting step change in the supply voltage of the RF power amplifier can cause a wireless handset to lose its connection with the wireless base station.

Accordingly, it is desirable to have a DC-to-DC converter that employs relatively small sized transistors and reactive components. In addition, it is desirable to have a DC-to-DC converter that can efficiently generate low DC output voltages corresponding to relatively low peak currents, and high DC output voltages corresponding to relatively high peak currents, in a continuous manner that minimizes undesirable output voltage drops and switching losses. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that the present invention may be practiced in conjunction with any number of practical circuits, subsystems, or systems, and that the RF power amplifier deployment described herein is merely one exemplary application for the invention.

For the sake of brevity, conventional techniques related to pulse width modulation, the operation of buck converters, DC voltage regulation, digital signal processing and digital logic, and other functional aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

Figure 5:
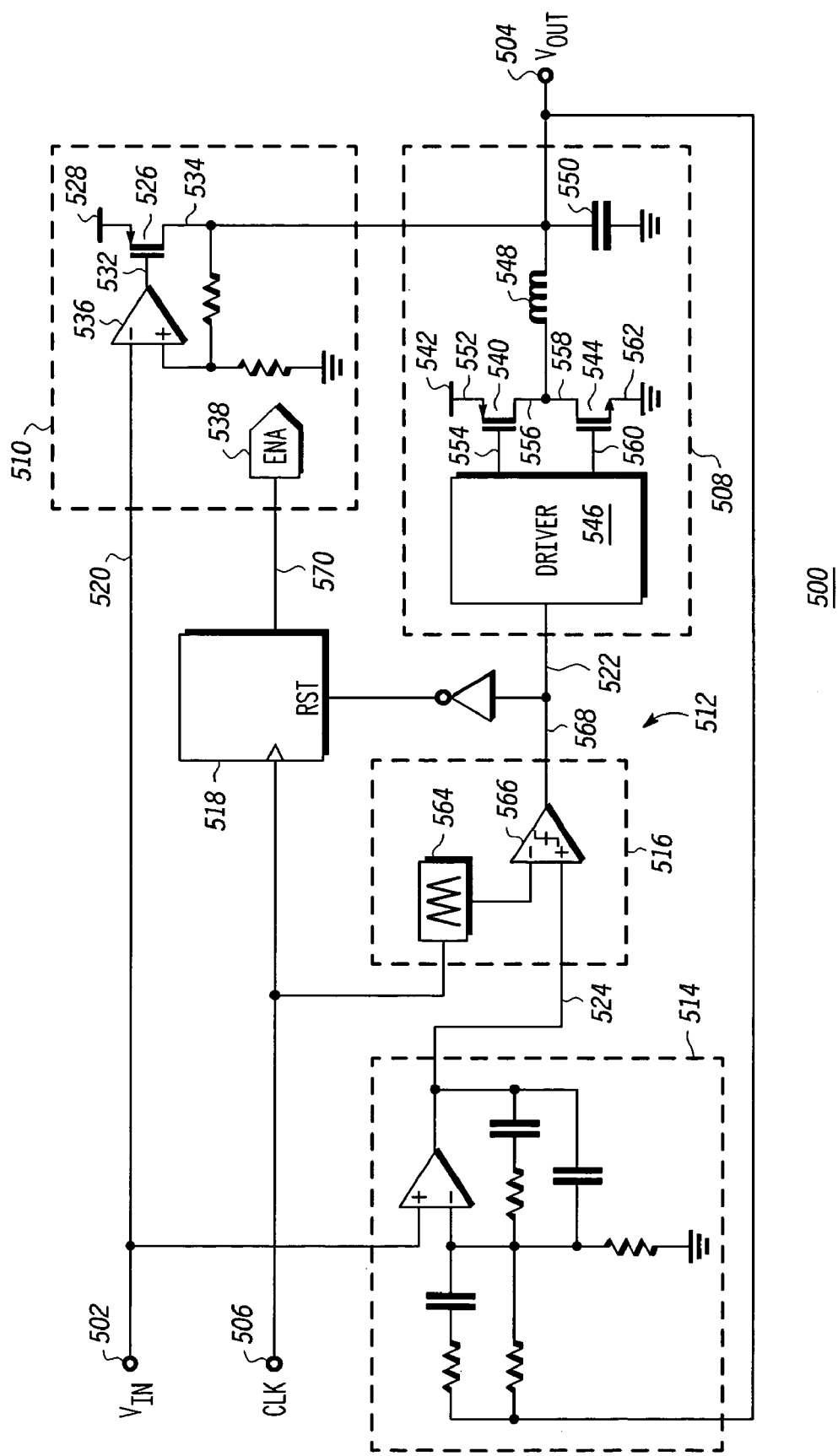
FIG. 5 is a schematic representation of a DC-to-DC converter configured in accordance with an example embodiment of the invention.

The following description refers to nodes or features being "connected" or "coupled" together. As used herein, unless expressly stated otherwise, "connected" means that one node/feature is directly or indirectly connected to another node/feature, and not necessarily physically. Likewise, unless expressly stated otherwise, "coupled" means that one node/feature is directly or indirectly coupled to another node/feature, and not necessarily physically. Thus, although the schematic shown in FIG. 5 depicts one example arrangement of elements, additional intervening elements, devices, features, or components may be present in an actual embodiment (assuming that the functionality of the circuit is not adversely affected).

Figure 3:
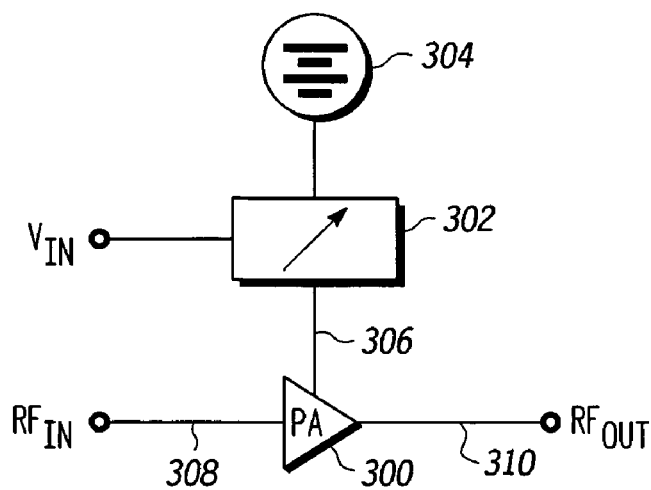
FIG. 3 is a schematic representation of an RF power amplifier and a DC-to-DC converter, which may be configured in accordance with the invention.

FIG. 3 is a schematic representation of an RF power amplifier 300 and a DC-to-DC converter 302, which may be configured in accordance with an example embodiment of the invention. In this example embodiment, DC-to-DC converter 302 is coupled to a DC power supply such as a battery 304 that provides a fixed DC supply voltage. DC-to-DC converter 302 is configured to receive a DC input voltage signal $V_{in}$ and to generate a DC output voltage signal $V_{out}$ (identified by reference number 306) in response to $V_{in}$. In a practical implementation, $V_{in}$ may vary with time and, consequently, $V_{out}$ also varies with time. RF power amplifier 300 receives an RF input signal 308, and amplifies RF input signal 308 to produce an RF output signal 310. RF power amplifier 300 may operate in accordance with established design techniques and, accordingly, the function of RF power amplifier 300 will not be described in detail herein. Depending upon the current operating requirements of RF power amplifier 300 (e.g., relatively low, relatively intermediate, or relatively high output power demand), $V_{in}$ is varied such that DC-to-DC converter 302 generates an appropriate DC supply voltage for one or more transistors in RF power amplifier 300.

Figure 1:
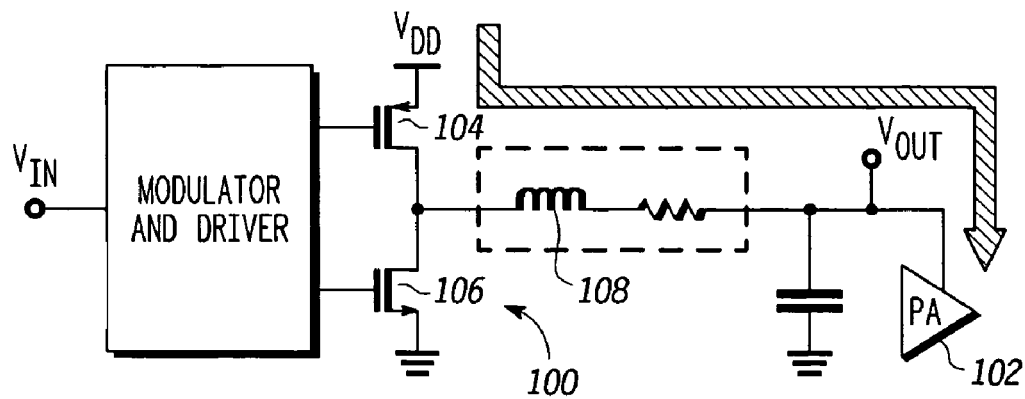
FIG. 1 is a schematic representation of a prior art buck converter connected to a power amplifier.
Figure 2:
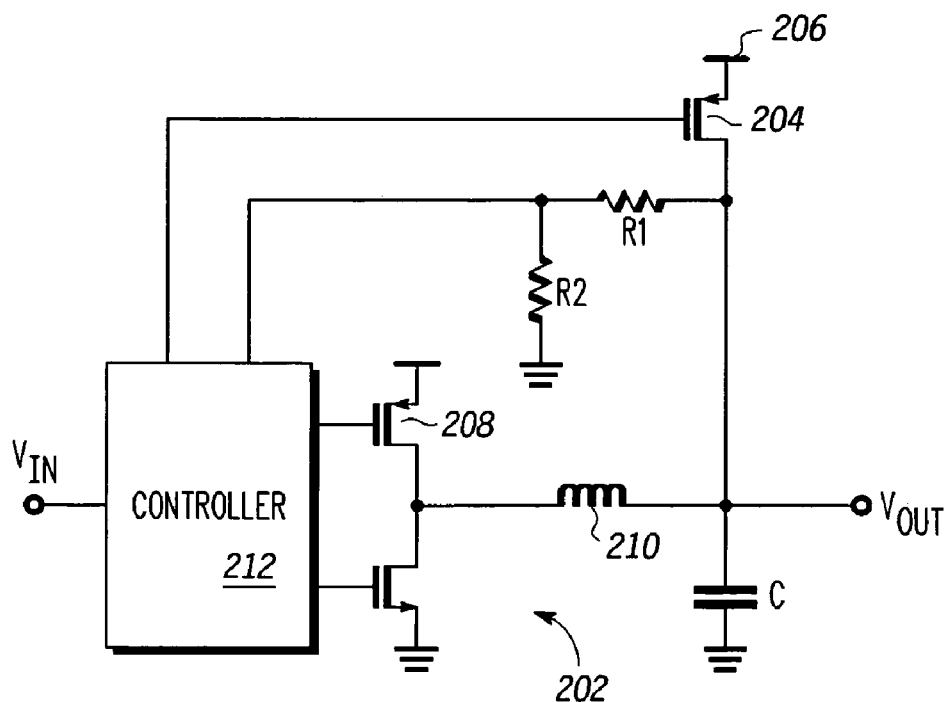
FIG. 2 is a schematic representation of a prior art DC-to-DC converter.
Figure 4:
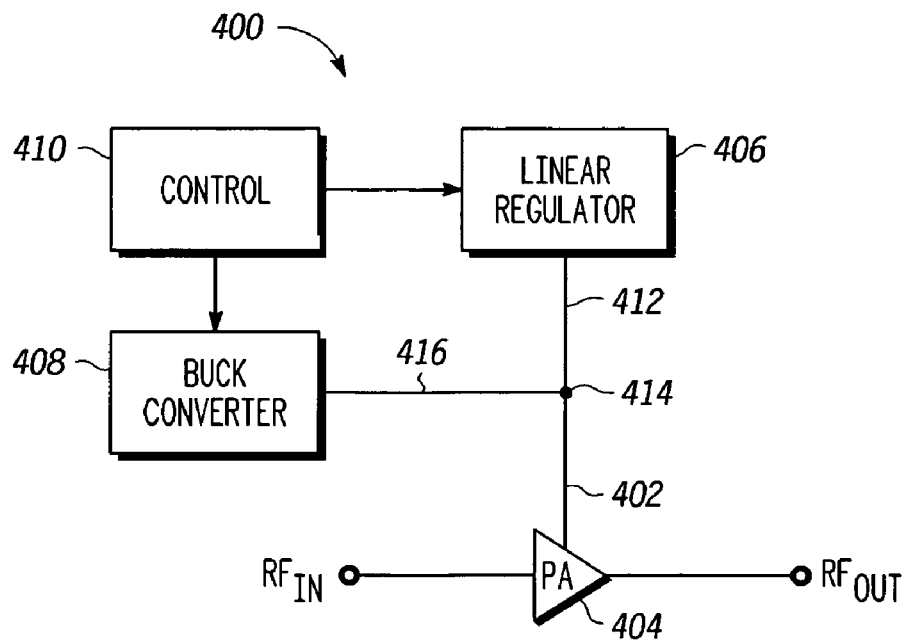
FIG. 4 is a high level block diagram of a DC-to-DC converter configured in accordance with an example embodiment of the invention.

FIG. 4 is a block diagram of a DC-to-DC converter 400 configured in accordance with an example embodiment of the invention DC-to-DC converter 400 may be utilized in the general arrangement shown in FIG. 1. Indeed, DC-to-DC converter 400 is coupled to provide a suitable DC output voltage 402 to an RF power amplifier 404. Generally, DC-to-DC converter 400 includes a linear voltage regulator 406, a buck converter 408, and a control architecture 410. Control architecture 410 may be coupled to both linear voltage regulator 406 and to buck converter 408 to enable control architecture 410 to regulate the operation of DC-to-DC converter 400 and, more particularly, to jointly control the operation of linear voltage regulator 406 and buck converter 408 in a continuous manner. Control architecture 410 may be realized with one or more analog and/or digital circuits, devices, components, or elements (including hardware, software, and/or firmware) configured to provide the functionality described herein.

Linear voltage regulator 406 is suitably configured to generate an output voltage 412 in response to an input voltage (not shown in FIG. 4). As described in more detail below, control architecture 410 enables linear voltage regulator 406 when RF power amplifier 404 requires relatively high current and corresponding high DC output voltage 402. In this example embodiment of the invention, linear voltage regulator 406 produces output voltage 412 (or a voltage derived from output voltage 412) at an output node 414 of DC-to-DC converter 400. Buck converter 408 is suitably configured to generate an output voltage 416 in response to the input voltage (i.e., the same input voltage processed by linear voltage regulator 406). As described in more detail below, control architecture 410 disables linear voltage regulator 406 when RF power amplifier 404 requires relatively low current and corresponding low DC output voltage 402. Consequently, when operating in a low output mode, buck converter 408 provides the power and DC-to-DC converter 400 operates in a manner equivalent to a traditional buck converter. In this example embodiment of the invention, buck converter 408 produces output voltage 416 (or a voltage derived from output voltage 416) at output node 414. In other words, linear voltage regulator 406 and buck converter 408 preferably share the same output node 414, which may be considered to be a buck converter output node and/or a linear regulator output node (thus, linear voltage regulator 406 and buck converter 408 may be considered to be connected in parallel) In this regard, depending upon the current operating state of DC-to-DC converter 400, DC output voltage 402 may be generated by buck converter 408 with no significant contribution from linear voltage regulator 406, or DC output voltage 402 may be generated primarily by linear voltage regulator 406 with some contribution from buck converter 408.

DC-to-DC converter 400 need not employ a large sized buck converter 408 (i.e., buck converter 408 need not utilize physically large transistors or a physically large inductor). As alluded to above, for low RF output power levels, linear regulator 406 can be disabled such that the power supplied to RF power amplifier 404 is provided by buck converter 408. On the other hand, for high RF output power levels that demand voltages beyond the capability of buck converter 408, control architecture 410 enables linear voltage regulator 406. Consequently, relatively high output power is primarily supplied by linear voltage regulator 406. In a practical embodiment of the invention, output voltage 412 of linear voltage regulator 406 can approach the voltage of the supply voltage (a fixed battery voltage in this example), thus resulting in very high efficiency. When the RF output power demand drops, control architecture 410 disables linear voltage regulator 406 such that relatively low output power is supplied by buck converter 408.

FIG. 5 is a schematic representation of a DC-to-DC converter 500 configured in accordance with an example embodiment of the invention. DC-to-DC converter 500 represents one example implementation suitable for use as DC-to-DC converter 400 shown in FIG. 4 and/or as DC-to-DC converter 302 shown in FIG. 3. DC-to-DC converter 500 generally includes an input node 502 for a DC input voltage $V_{in}$, an output node 504 for a DC output voltage $V_{out}$, and a clock signal node 506 for a clock input CLK. As described above, DC-to-DC converter 500 is configured to generate $V_{out}$ in response to $V_{in}$ and, more particularly, to generate $V_{out}$ in a manner that satisfies the changing power requirement needs of an RF power amplifier (not shown in FIG. 5).

DC-to-DC converter 500 generally includes a buck converter 508, a linear voltage regulator 510, a control architecture 512, and a compensation circuit 514. In this example, control architecture 512 comprises a pulse width modulator ("PWM") 516 and a counter 518. Linear voltage regulator 510 is configured to receive an input 520, which may be $V_{in}$, as depicted in FIG. 5, or an input derived from $V_{in}$. The output of linear voltage regulator 510 is coupled to output node 504. Buck converter 508 is configured to receive a drive signal input 522, which may be $V_{in}$ or an input derived from $V_{in}$, as depicted in FIG. 5. The output of buck converter 508 is also coupled to output node 504. The example DC-to-DC converter 500 shown and described herein utilizes MOSFET transistors in linear voltage regulator 510 and in buck converter 508. It should be appreciated, however, that a practical embodiment of the invention may utilize different transistor types configured to provide equivalent functionality. In this regard, a practical DC-to-DC converter 500 may utilize, for example, bipolar transistors or HFET transistors in lieu of MOSFET transistors.

Compensation circuit 514 is coupled to input node 502 and to output node 504, thus creating a feedback loop for DC-to-DC converter 500. Briefly, compensation circuit 514 compares $V_{in}$ (or an input based upon or derived from $V_{in}$) to a scaled version of $V_{out}$, and generates a signal that can be utilized as a first input 524 to PWM 516. In practice, compensation circuit 514 need not be realized as shown in FIG. 5, and the particular topology of compensation circuit 514 is merely one suitable example. Furthermore, the specific arrangement of resistors and capacitors in compensation circuit 514, and the particular resistance and capacitance values, can be selected using conventional methodologies to adjust the loop parameters to achieve stability and regulation, and/or to provide a desired overall gain for DC-to-DC converter 500.

Linear voltage regulator 510 includes an output transistor 526, which is connected to a supply voltage 528 (a fixed DC voltage in the example embodiment of the invention). Transistor 526 includes a source 530 connected to supply voltage 528, a gate 532, and a drain 534 connected to output node 504. Linear voltage regulator 510 also includes an operational amplifier 536 having a negative input node for input 520, a positive input node for a feedback path, and an output node. In this example, the output node of operational amplifier 536 is connected to gate 532. Notably, linear voltage regulator 510 also includes an enable element 538, which controls whether linear voltage regulator 510 is active or inactive. In the preferred embodiment of the invention, enable element 538 responds to a logical control signal produced by counter 518.

Buck converter 508 includes a first transistor 540, which is connected to a supply voltage 542 (a fixed DC voltage in the example embodiment of the invention, and possibly corresponding to supply voltage 538), a second transistor 544, a driver architecture 546, an inductance 548, and a capacitance 550. Transistor 540 and/or transistor 544 function as switches or a switching arrangement for DC-to-DC converter 500. First transistor 540 includes a source 552 connected to supply voltage 542, a gate 554, and a drain 556. Gate 554 is connected to driver architecture 546, and drain 556 is connected to a first end of inductance 548. Second transistor 544 includes a drain 558, a gate 560, and a source 562. Drain 558 is connected to drain 556 of first transistor 540 and to the first end of inductance 548, while source 562 is grounded. A second end of inductance 548 is connected to output node 504, and capacitance 550 is connected between output node 504 and ground.

In accordance with one practical embodiment of the invention, buck converter 508 utilizes small sized switching transistors 540/544 (compared to output transistor 526, which is relatively large in size) having relatively high "on" resistances, along with a small sized inductance 548. Since the current flowing through the transistors 540/544 and the inductance 548 is low at low RF output levels, the use of physically small switch transistors 540/544 and a physically small inductance 548 with high DC resistance will not cause a severe voltage drop and will not significantly increase the resistive loss. Furthermore, the use of small switching transistors 540/544 reduces the switching loss associated with buck converter 408.

Driver architecture 546 provides the input drive signal to buck converter 508 in response to drive signal input 522, which represents a pulse width modulated signal generated by PWM 516 in this example embodiment In this regard, drive signal input 522 has characteristics determined by the input voltage $V_{in}$. Using techniques known to those skilled in the art, driver architecture 546 reacts to the pulse width and/or duty cycle of drive signal input 522 and controls the operation of transistors 540/544 to vary the DC output of buck converter 508. While DC-to-DC converter 500 is operating in the buck converter mode, driver architecture 546 causes transistors 540/544 to alternately switch on and off in a desired manner that results in current flow through inductance 548. In practical embodiments, driver architecture 546 may incorporate an inverter chain and shoot-through protection configured to support its functionality.

As described above, DC-to-DC converter 500 is configured to operate in a linear voltage regulator mode when generating a relatively high $V_{out}$ and in a buck converter mode when generating a relatively low $V_{out}$. Control architecture 512 is responsible for enabling and disabling linear voltage regulator 510 as necessary depending upon the real-time operating conditions and power requirements of the RF power amplifier. In the example embodiment, control architecture 512 is suitably configured to enable linear voltage regulator 510 for operation in the linear regulator mode, and to disable linear voltage regulator for operation in the buck converter mode. As described in more detail below, control architecture 512 is preferably configured to enable linear voltage regulator 510 if $V_{in}$ exceeds a first transition voltage continuously for a predetermined period of time, and to disable linear voltage regulator 510 if $V_{in}$ decreases below a second transition voltage (which may, but need not be, equal to the first transition voltage). Control architecture 512 is also responsible for regulating the operation of buck converter 508.

In this example embodiment of the invention, control architecture 512 operates in conjunction with the clock signal present at clock signal node 506. In particular, the same clock signal serves as an input to counter 518 and as an input to PWM 516. In practice, the clock signal may be any suitable waveform that conveys timing information that can be interpreted by digital logic circuits. The clock signal may be provided by any suitable source such as a conventional clock generator circuit. In one example embodiment of the invention suitable for wireless handset applications, the clock signal has a frequency range of approximately 25–50 MHz.

Figure 6:
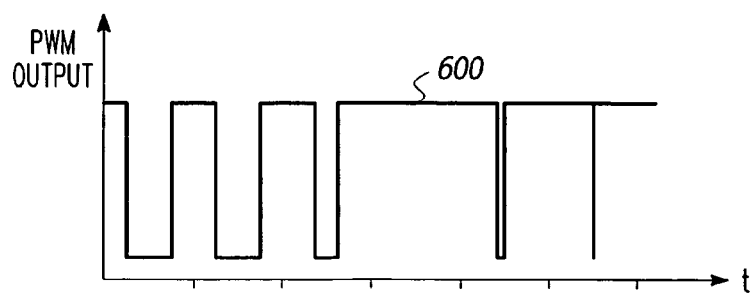
FIG. 6 is a diagram of an example pulse width modulated signal that may be generated by a DC-to-DC converter configured in accordance with an example embodiment of the invention.

PWM 516 is coupled between input node 502 and counter 518 (and between input node 502 and buck converter 508). PWM 516 includes a triangle wave generator 564 and a comparator 566. Triangle wave generator 564 is configured to produce a triangle wave having a frequency that is related to the frequency of the clock signal. As depicted in FIG. 5, the output of triangle wave generator 564 serves as the negative input to comparator 566, while first input 524 serves as the positive input to comparator 566. In accordance with known pulse width modulation techniques, comparator generates a PWM output 568 in response to the clock signal, $V_{in}$, and $V_{out}$. More specifically, PWM output 568 includes a sequence of pulses, where the pulse width increases as $V_{in}$ increases, and vice versa. In other words, PWM output 568 has characteristics that are determined by the clock signal, by $V_{in}$, and/or by $V_{out}$. In this example embodiment, the PWM output 568 is preferably used as both a drive signal input for buck converter 508 and as a reset signal for counter 518. FIG. 6 is a diagram of an example PWM signal 600 that may be generated by PWM 516. In FIG. 6 (and in FIGS. 7–9), the markers on the horizontal time scale represent cycles of the clock signal, e.g., the respective high-to-low transition points of the clock signal. In this example, the duty cycle of PWM signal 600 increases over time until it reaches 100% (or effectively equal to 100%).

Figure 7:
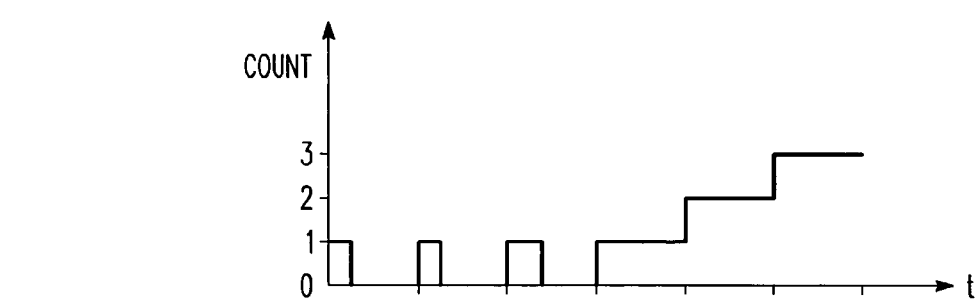
FIG. 7 is a diagram showing an example status of a counter for the example pulse width modulated signal shown in FIG. 6.

Counter 518 operates in a conventional manner to maintain a digital count of clock cycles. Counter 518 may include a reset feature that, when activated, clears or zeros the current count. In other words, counter 518 is incremented with each clock pulse as long as counter 518 is not reset. In the example embodiment of the invention, counter 518 is reset whenever PWM output 568 is in a logic low state. In practice, counter 518 will continuously reset itself until the duty cycle of PWM output 568 approaches 100%. At such high duty cycles, the logic low state of PWM output 568 becomes undetectable by the reset function of counter 518 and, consequently, counter 518 increments its count with each subsequent clock cycle until $V_{in}$ decreases and the duty cycle of PWM output 568 decreases. FIG. 7 is a diagram showing the status of counter 518 versus time for the example PWM signal 600 shown in FIG. 6. As shown in FIG. 7, counter 518 is reset to a zero state in response to the logic low transitions of PWM signal 600. After the duty cycle of PWM signal 600 changes to 100%, however, counter 518 begins to increment with each clock cycle. In this example, counter 518 reaches a count of three. Although not shown in FIG. 7, counter 518 will continue to increment its count as long as the duty cycle of PWM signal 600 does not fall below a certain threshold; once a detectable logic low state appears in PWM signal 600, counter 518 is immediately reset.

Figure 8:
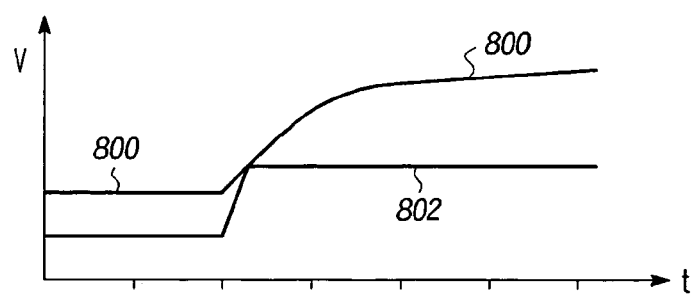
FIG. 8 is a graph of input and output voltages versus time for a DC-to-DC converter configured in accordance with an example embodiment of the invention.

In response to an increase in the pulse width of PWM signal 600, buck converter 508 continues to increase its output voltage until it reaches its maximum output. FIG. 8 is a graph of an example output voltage 800 and the corresponding input voltage 802 versus time for a DC-to-DC converter configured in accordance with an example embodiment of the invention. Consistent with the example described herein, output voltage 800 may be generated in response to PWM signal 600. In this regard, output voltage 800 remains stable over the first two clock cycles because PWM signal 600 does not change during this time. Output voltage 800 increases over the subsequent clock cycles, however, because the duty cycle of PWM signal 600 increases until it reaches 100%. Output filtering ensures that output voltage 800 experiences a smooth transition rather than a step change.

Figure 9:
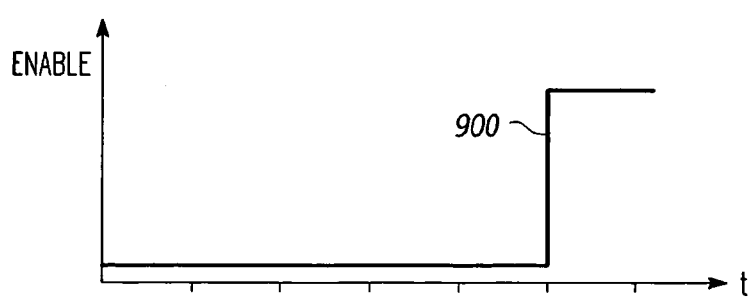
FIG. 9 is a graph depicting the enable status of a linear voltage regulator for a DC-to-DC converter configured in accordance with an example embodiment of the invention.

Counter 518 is also configured to generate an enable signal 570 at an enable signal output as necessary to enable/disable linear voltage regulator 510. In accordance with an example embodiment of the invention, counter 518 is suitably configured to generate enable signal 570 once its count reaches a threshold value. In other words, enable signal 570 is generated only after a specified number of clock cycles has elapsed without reset of counter 518. In the example embodiment described herein, the threshold count is three. The threshold count, however, is arbitrary and may be selected to suit the needs of the particular application. From an operational standpoint, counter 518 is suitably configured to enable linear voltage regulator 510 if $V_{in}$ exceeds a transition voltage for a preset number of clock cycles. In this regard, FIG. 9 is a graph depicting an enable signal 900 for a DC-to-DC converter that utilizes a control scheme as described herein. FIG. 9 corresponds to PWM signal 600 depicted in FIG. 6 and the counter status depicted in FIG. 7. Notably, enable signal 900 remains low until the count reaches three. Thereafter, enable signal 900 assumes a logic high state, which causes linear voltage regulator 510 to activate. In contrast, when counter 518 is subsequently reset, enable signal 900 returns to a logic low state, which causes linear voltage regulator 510 be become disabled.

In the foregoing manner, control architecture 512, which may include PWM 516 and counter 518 in a practical embodiment of the invention, determines whether to operate DC-to-DC converter 500 in the linear voltage regulator mode or the switching buck converter mode. While operating in the buck converter mode, linear voltage regulator 510 is disabled and a relatively high current flows through inductance 548. Since transistor 526 is off at this time, there is essentially no power dissipated in transistor 526, which prevents power loss that would otherwise result from having transistor 526 and transistor 544 on at the same time. In this regard, whenever transistor 544 is on, the output of comparator 566 (i.e., PWM output 568) is low, which keeps linear voltage regulator 510 disabled.

To ensure a smooth and continuous transitions between the linear voltage regulator mode and the switching buck converter mode, control architecture 512 keeps transistor 540 of buck converter 508 continuously on, which maintains current flow through inductance 548 of buck converter 508. Thus, even though linear voltage regulator 510 provides the bulk of the output current flow, buck converter 508 is controlled to provide at least some current flow through output inductance 548 (the current flow through output inductance 548 in the linear regulator mode is significantly less than the current flow through output inductance 548 in the buck converter mode). In accordance with a practical embodiment of the invention, the gain of linear voltage regulator 510 is selected to be slightly less than the gain of buck converter 508. The slight error voltage generated by the feedback path for DC-to-DC converter 500 will keep comparator 566 at a logic high state. If, on the other hand, the two loops have the same gain, the output of compensation circuit 514 may be undetermined. Such an undetermined state can lead to errors in PWM output 568 and, consequently, can cause counter 518 to generate false resets.

If the input voltage $V_{in}$ decreases by a sufficient amount, the output of compensation circuit 514 will suddenly drop, thus causing control architecture 512 to reset counter 518 and disable linear voltage regulator 510. When DC-to-DC converter 500 transitions back to the buck converter mode, PWM 516 is again generating measurable pulses that can drive buck converter 508 in a normal switching fashion, while resetting counter 518.

In contrast to the techniques described herein, if buck converter 508 is completely shut off when DC-to-DC converter 500 changes to the linear voltage regulator mode, the current through inductance 548 will drop to zero, and $V_{out}$ will drop to zero when linear voltage regulator 510 is turned on. Similarly, if buck converter 508 is completely disabled during the linear regulator mode, $V_{out}$ will drop to zero when DC-to-DC converter 500 changes back to the buck converter mode, i.e., before transistor 540 turns on.

Again, at high RF output levels, DC-to-DC converter 500 employs linear voltage regulator 510. Since the supply voltage needed by the associated RF power amplifier at high RF output levels approaches the battery voltage, the efficiency can be fairly high. In addition, the maximum current handled by DC-to-DC converter 500 need only flow through transistor 526 of linear voltage regulator 510 (in contrast to the prior art buck converter 100 shown in FIG. 1, in which the maximum current must flow through transistor 104 and inductor 108). For lower RF power levels, linear voltage regulator 510 can be disabled to allow buck converter 508 to supply power to the RF power amplifier. Since buck converter 508 need only supply the RF power amplifier at relatively low power levels, the size of transistors 540/544 can be significantly smaller than the size of prior art buck converter transistors (for example, transistors 104/106 in prior art buck converter 100). Notably, the smaller transistor sizes results in lower switching loss and higher efficiency at light loads. Furthermore, the maximum current flow through inductance 548 is greatly reduced which allows the use of a smaller inductance 548 with relatively high DC resistance. Consequently, the footprint and circuit board space required for a practical implementation of DC-to-DC converter 500 can be reduced, which is beneficial from a packaging and cost perspective.

Figure 10:
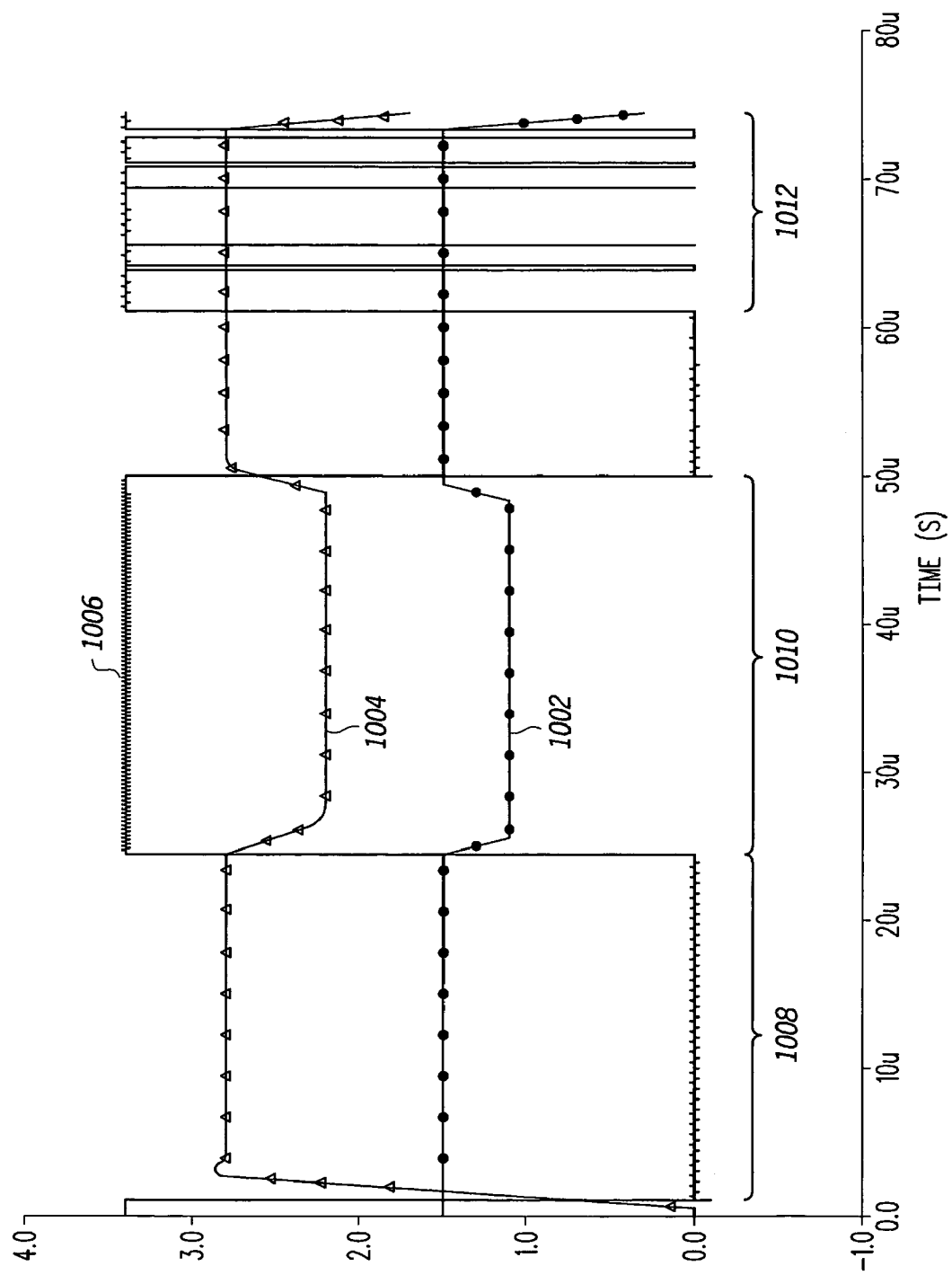
FIG. 10 is a graph showing input and output voltages for a DC-to-DC converter configured in accordance with an example embodiment of the invention.

FIG. 10 is a graph showing example input and output voltages for a DC-to-DC converter configured as described above. FIG. 10 depicts a $V_{in}$ plot 1002 (identified by circles), a corresponding $V_{out}$ plot 1004 (identified by triangles), and a corresponding control signal plot 1006. Referring again to FIG. 5, control signal plot 1006 may represent enable signal 570, the inverse of enable signal 570, or a signal derived from enable signal 570. Alternatively, control signal plot 1006 may represent a drive signal for transistor 540, the switching state of transistor 540, or the switching between buck converter and linear voltage regulator modes. FIG. 10 depicts a linear voltage regulator period 1008 during which linear voltage regulator 510 is enabled, followed by a buck converter period 1010 during which linear voltage regulator 510 is disabled, and a threshold period 1012 during which the DC-to-DC converter operates near the mode-switching transition point.

Figure 11:
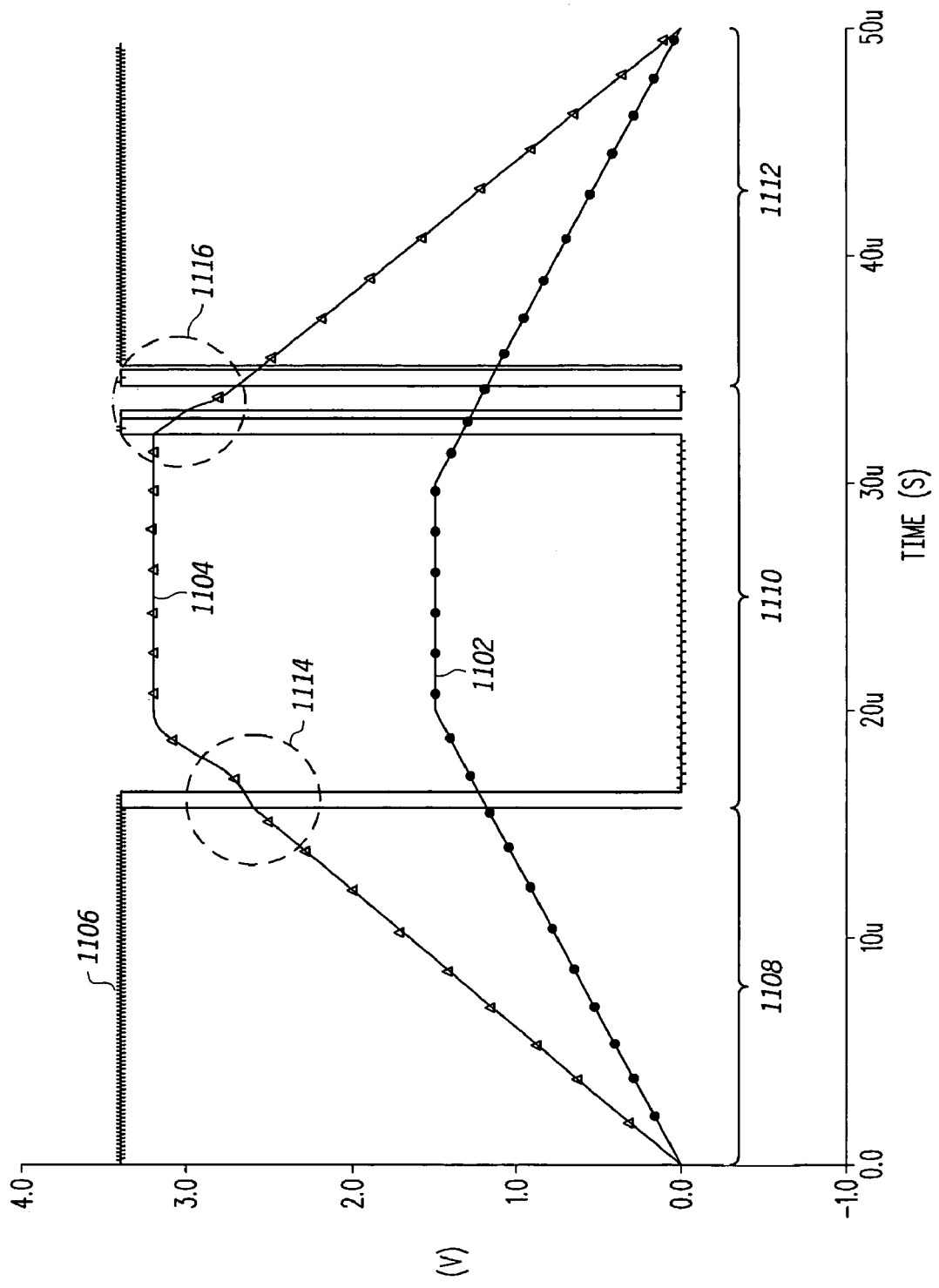
FIG. 11 is a graph showing input and output voltages at mode transition points for a DC-to-DC converter configured in accordance with an example embodiment of the invention.

FIG. 11 is another graph showing example input and output voltages for a DC-to-DC converter configured as described above. FIG. 11 depicts a $V_{in}$ plot 1102 (identified by circles), a corresponding $V_{out}$ plot 1104 (identified by triangles), and a corresponding control signal plot 1106. Control signal plot 1106 may represent any of the signals or states described above in connection with control signal plot 1006 (see FIG. 10). FIG. 11 depicts the transition from a first buck converter mode 1108 to a linear voltage regulator mode 1110, and the transition from linear voltage regulator mode 1110 to a second buck converter mode 1112. This example graph depicts the transition between states with a 20 microsecond ramp. The precise transition point 1114 from first buck converter mode 1108 to linear voltage regulator mode 1110 is identified by the dashed circle. In this example, transition point 1114 causes a maximum error of about 30–40 mV. In practice, this error can be reduced by lowering the preset count value for enabling linear voltage regulator 510 (at the expense of possible power loss due to false triggering). The precise transition point 1116 from linear voltage regulator mode 1110 to second buck converter mode 1112 is identified by the solid circle. In this example, transition point 1116 has a relatively slow response at the beginning, but is smoother than transition point 1114. The slow response at the beginning is due to the very low bandwidth when transistor 526 of linear voltage regulator 510 is operating in the triode region. In practical embodiments, bandwidth can be increased by dynamic biasing at the expense of increased power consumption.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A DC-to-DC converter comprising:
   a buck converter comprising:
      a plurality of transistors;
      a buck converter output node; and
      an output inductance coupled between said plurality of transistors and said buck converter output node;
   a linear voltage regulator comprising a regulator output node coupled to said buck converter output node; and
   a control architecture coupled to said buck converter and to said linear voltage regulator, said control architecture being configured to enable said linear voltage regulator for a linear regulator mode of operation to provide output voltage at said regulator output node while driving said buck converter to maintain current flow through said output inductance, and said control architecture being configured to disable said linear voltage regulator for a buck converter mode of operation.

2. A DC-to-DC converter according to claim 1, said linear voltage regulator comprising an output transistor coupled to said regulator output node, said output transistor being large in size relative to said plurality of transistors.

3. A DC-to-DC converter according to claim 1, further comprising an input node for an input voltage, said control architecture being configured to enable said linear voltage regulator if said input voltage exceeds a transition voltage continuously for a period of time.

4. A DC-to-DC converter according to claim 3, said control architecture comprising a counter configured to generate an enable signal for said linear voltage regulator if said input voltage exceeds said transition voltage for a preset number of clock cycles.

5. A DC-to-DC converter according to claim 4, further comprising a pulse width modulator coupled between said input node and said counter, said pulse width modulator being configured to generate a reset signal for said counter, said reset signal having characteristics determined by said input voltage.

6. A DC-to-DC converter according to claim 1, further comprising:
an input node for an input voltage; and
a pulse width modulator coupled between said input node and said buck converter, said pulse width modulator being configured to generate a drive signal for said buck converter, said drive signal having characteristics determined by said input voltage.

7. A DC-to-DC converter according to claim 1, further comprising an input node for an input voltage, said control architecture comprising:
a pulse width modulator configured to generate a pulse width modulated signal having a pulse width corresponding to said input voltage; and
a counter comprising a reset feature coupled to receive said pulse width modulated signal, and an enable signal output coupled to said linear voltage regulator, said counter being configured to generate an enable signal for said linear voltage regulator in response to said pulse width modulated signal.

8. A DC-to-DC converter according to claim 7, said pulse width modulator being coupled to said buck converter to provide said pulse width modulated signal as a drive signal for said buck converter.

9. A DC-to-DC converter comprising:
an output node for an output voltage;
a buck converter comprising a switching arrangement and an output inductance coupled between said switching arrangement and said output node;
a linear voltage regulator comprising a regulator output node coupled to said output node; and
a control architecture coupled to said buck converter and to said linear voltage regulator,
said control architecture being configured to switch said DC-to-DC converter between a buck converter mode supported by said buck converter, and a linear regulator mode supported primarily by said linear voltage regulator, while maintaining continuous current flow through said output inductance, and said control architecture being configured to enable said linear voltage regulator for said linear regulator mode, and to disable said linear voltage regulator for said buck converter mode.

10. A DC-to-DC converter according to claim 9, further comprising an input node for an input voltage, said control architecture being configured to enable said linear voltage regulator when said input voltage exceeds a transition voltage continuously for a period of time.

11. A DC-to-DC converter according to claim 10, said control architecture comprising a counter configured to generate an enable signal for said linear voltage regulator if said input voltage exceeds said transition voltage for a preset number of clock cycles.

12. A DC-to-DC converter according to claim 11, further comprising a pulse width modulator coupled between said input node and said counter, said pulse width modulator being configured to generate a reset signal for said counter, said reset signal having characteristics determined by said input voltage.

13. A DC-to-DC converter according to claim 9, said linear voltage regulator comprising an output transistor coupled to said regulator output node, said switching arrangement comprising a plurality of transistors, and said output transistor being large in size relative to said plurality of transistors.

14. A method for generating a DC output voltage from a DC input voltage in a DC-to-DC converter comprising an output node, a buck converter having an output inductance coupled to the output node, and a linear voltage regulator having an output coupled to the output node, said method comprising:
receiving an input voltage having an input voltage level;
transitioning between a buck converter mode and a linear regulator mode in response to said input voltage level;
in said buck converter mode, disabling the linear voltage regulator while driving the buck converter to produce a first current flow through the output inductance; and
in said linear regulator mode, enabling the linear voltage regulator while driving the buck converter to produce a second current flow through the output inductance, said second current flow being less than said first current flow.

15. A method according to claim 14, wherein said transitioning step comprises transitioning from said buck converter mode to said linear regulator mode in response to said input voltage level exceeding a transition voltage continuously for a period of time.

16. A method according to claim 15, further comprising initiating a count when said input voltage level exceeds said transition voltage, wherein enabling the linear voltage regulator occurs when said input voltage level exceeds said transition voltage for a preset number of clock cycles.

17. A method according to claim 16, further comprising resetting said count when said input voltage level decreases below a second transition voltage.

18. A method according to claim 14, wherein said transitioning step comprises transitioning from said linear regulator mode to said buck converter mode in response to said input voltage level decreasing below a transition voltage.

* * * * *